US011245045B2

(12) United States Patent
Jacques et al.

(10) Patent No.: US 11,245,045 B2
(45) Date of Patent: Feb. 8, 2022

(54) ENCAPSULANT OF A PHOTOVOLTAIC MODULE

(71) Applicant: SK GLOBAL CHEMICAL CO., LTD., Seoul (KR)

(72) Inventors: Guillaume Jacques, Elboeuf (FR); Stephane Bizet, Barc (FR); Benoit Savignat, Bernay (FR); Molly Cannet, Bernay (FR)

(73) Assignee: SK GLOBAL CHEMICAL CO., LTD., Seoul (KR)

( * ) Notice: Subject to any disclaimer, the term of this patent is extended or adjusted under 35 U.S.C. 154(b) by 0 days.

(21) Appl. No.: 15/318,339

(22) PCT Filed: Jun. 26, 2015

(86) PCT No.: PCT/FR2015/051733
§ 371 (c)(1),
(2) Date: Dec. 12, 2016

(87) PCT Pub. No.: WO2016/001540
PCT Pub. Date: Jan. 7, 2016

(65) Prior Publication Data
US 2017/0117426 A1 Apr. 27, 2017

(30) Foreign Application Priority Data
Jul. 2, 2014 (FR) ...................... 1456309

(51) Int. Cl.
*H01L 31/048* (2014.01)
*C08K 5/14* (2006.01)
(Continued)

(52) U.S. Cl.
CPC ........ *H01L 31/0481* (2013.01); *C08F 210/02* (2013.01); *C08K 5/14* (2013.01);
(Continued)

(58) Field of Classification Search
CPC . H01L 31/048; H01L 31/0481; H01L 31/049; Y02E 10/50
(Continued)

(56) References Cited

U.S. PATENT DOCUMENTS 8,211,265 B2  7/2012 Samuels
2011/0146758 A1* 6/2011 Trouilhet .............. B32B 27/308
136/249

(Continued)

FOREIGN PATENT DOCUMENTS

CN      102482454 B   3/2014
CN      102939201 B   12/2014
(Continued)

OTHER PUBLICATIONS

English machine translation of JP 2005-126708A. (Year: 2005).*
(Continued)

Primary Examiner — Lindsey A Bernier
(74) Attorney, Agent, or Firm — Buchanan Ingersoll & Rooney P.C.

(57) ABSTRACT

An encapsulant of a photovoltaic module, intended for coating a photovoltaic cell (10), including: a copolymer of ethylene-alkyl acrylate, the melt flow index (MFI) of the copolymer being 1 g/10 min to 40 g/10 min; and a silane making up 0.1% to 0.5% of the weight of the composition; wherein the encapsulant also includes a cross-linking agent making up 0.1% to 0.5% of the weight of the composition and wherein the copolymer makes up at least 99% of the weight of the composition. Also, a use of such an encapsulant in a photovoltaic module as well as to a photovoltaic module including such an encapsulant.

14 Claims, 1 Drawing Sheet

(51) Int. Cl.

| | | |
|---|---|---|
| *C08K 5/5425* | (2006.01) | |
| *C08L 23/08* | (2006.01) | |
| *C08F 210/02* | (2006.01) | |
| *H01L 31/042* | (2014.01) | |
| *C08K 5/5419* | (2006.01) | |
| *H01L 31/049* | (2014.01) | |
| *C08F 230/08* | (2006.01) | |

(52) U.S. Cl.
CPC .......... *C08K 5/5419* (2013.01); *C08K 5/5425* (2013.01); *C08L 23/08* (2013.01); *C08L 23/0807* (2013.01); *H01L 31/042* (2013.01); *H01L 31/048* (2013.01); *H01L 31/049* (2014.12); *C08F 230/08* (2013.01); *Y02E 10/50* (2013.01)

(58) Field of Classification Search
USPC ................................. 136/244, 251, 252, 259
See application file for complete search history.

(56) References Cited

U.S. PATENT DOCUMENTS

| | | | | |
|---|---|---|---|---|
| 2011/0297314 | A1* | 12/2011 | Samuels | ................. B32B 27/16 156/285 |
| 2012/0145241 | A1* | 6/2012 | Fujiki | ............... B32B 17/10018 136/259 |
| 2012/0255610 | A1* | 10/2012 | Bokria | .............. B32B 17/10678 136/259 |
| 2013/0340828 | A1* | 12/2013 | Kataoka | .............. H01L 31/0481 136/259 |
| 2014/0130865 | A1 | 5/2014 | Fujiki | |

FOREIGN PATENT DOCUMENTS

| | | | | |
|---|---|---|---|---|
| EP | 1 990 840 | A1 | 11/2008 | |
| EP | 2 685 508 | A1 | 1/2014 | |
| FR | 2 981 655 | A1 | 4/2013 | |
| JP | 2005-002245 | A | 1/2005 | |
| JP | 2005-126708 | A | 5/2005 | |
| JP | 2005126708 | A * | 5/2005 | ....... B32B 17/10788 |
| JP | 2006159497 | A | 6/2006 | |
| WO | WO 03/085681 | A1 | 10/2003 | |
| WO | WO 2006/095911 | A1 | 9/2006 | |
| WO | WO 2009/138679 | A1 | 11/2009 | |
| WO | 2010/003503 | A1 | 1/2010 | |
| WO | 2010124189 | A1 | 10/2010 | |
| WO | WO-2012121003 | A1 * | 9/2012 | ................ C08J 5/18 |
| WO | 2012/138986 | A1 | 10/2012 | |

OTHER PUBLICATIONS

International Search Report (PCT/ISA/210) dated Oct. 21, 2015, by the European Patent Office as the International Searching Authority for International Application No. PCT/FR2015/051733.

Written Opinion (PCT/ISA/237) dated Jan. 1, 2016, by the European Patent Office as the International Searching Authority for International Application No. PCT/FR2015/051733.

Notice of Opposition dated Apr. 30, 2019, by the European Patent Office in corresponding European Patent Application No. 15745526.2-1102. (22 pages).

Office Action (Notice of Reasons for Refusal) dated Jun. 21, 2019, by the Japanese Patent Office in corresponding Japanese Patent Application No. 2016-575929, and an English Translation of the Office Action. (8 pages).

Office Action (Examination Report) dated Dec. 11, 2019, by the Intellectual Property India—Government of India in corresponding Indian Patent Application No. 201617042340, with an English Translation. (6 pages).

* cited by examiner

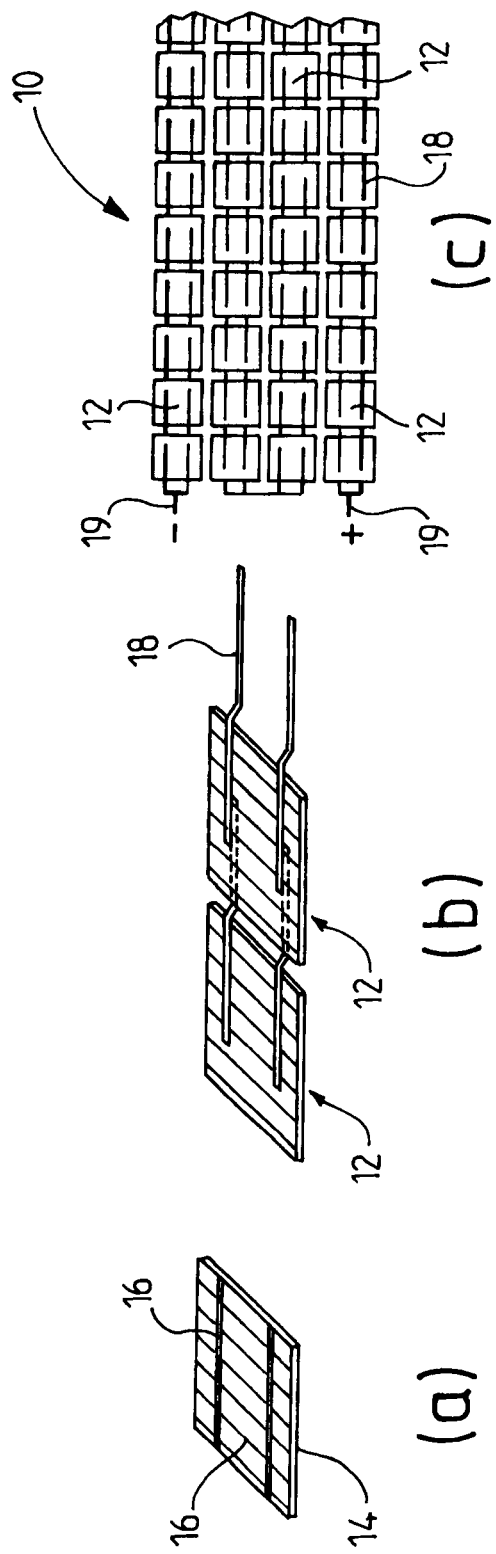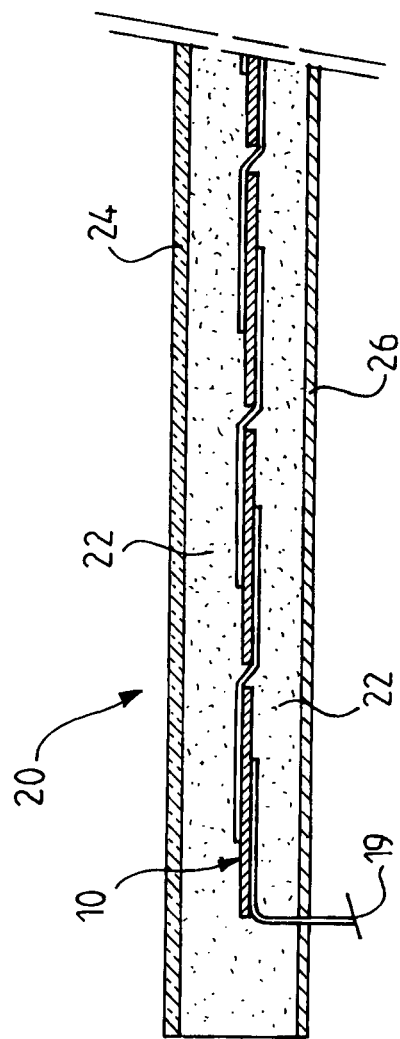

ENCAPSULANT OF A PHOTOVOLTAIC MODULE

FIELD OF THE INVENTION

One subject of the invention is a photovoltaic module encapsulant based on an ethylene/alkyl acrylate copolymer in which a crosslinking agent (peroxides or isocyanates or any other component having a crosslinking function) is present only in very small amounts. The present invention also relates to a photovoltaic module, or to the use of this encapsulant composition in such a module, comprising, besides the encapsulant layer, at least one adjacent layer forming a "frontsheet" or "backsheet", more generally these three successive layers: "frontsheet", encapsulant and "backsheet".

Global warming, related to the greenhouse gases given off by fossil fuels, has led to the development of alternative energy solutions which do not emit such gases during the operation thereof, such as, for example, photovoltaic modules. A photovoltaic module comprises a "photovoltaic cell", this cell being capable of converting light energy into electricity.

There are many types of photovoltaic panel structures.

A conventional photovoltaic cell has been represented in FIG. 1; this photovoltaic cell 10 comprises individual cells 12, one individual cell containing a photovoltaic sensor 14, generally based on silicon treated in order to obtain photoelectric properties, in contact with electron collectors 16 placed above (upper collectors) and below (lower collectors) the photovoltaic sensor. The upper collectors 16 of an individual cell are connected to the lower collectors 16 of another individual cell 12 via conducting bars 18, generally consisting of an alloy of metals. All these individual cells 12 are connected to one another, in series and/or in parallel, in order to form the photovoltaic cell 10. When the photovoltaic cell 10 is placed under a light source, it delivers a direct electric current which can be recovered at the terminals 19 of the cell 10.

With reference to FIG. 2, the photovoltaic module 20 comprises the photovoltaic cell 10 of FIG. 1 encased in an "encapsulant", the latter being composed of an upper part 22 and of a lower part 23. An upper protective layer 24 (known under the term "frontsheet", used hereinafter) and a layer which protects the back of the module (known under the term "backsheet", also used hereinafter) 26 are positioned on either side of the encapsulated cell.

Impact and moisture protection of the photovoltaic cell 10 is provided by the upper protective layer 24, generally made of glass.

The backsheet 26, for example a multilayer film based on fluoropolymer and on polyethylene terephthalate, contributes to the moisture protection of the photovoltaic module 20 and to the electrical insulation of the individual cells 12 in order to prevent any contact with the external environment.

The encapsulant 22 must perfectly adopt the shape of the space existing between the photovoltaic cell 10 and the protective layers 24 and 26 in order to avoid the presence of air, which would limit the efficiency of the photovoltaic module. The encapsulant 22 must also prevent contact of the individual cells 12 with atmospheric oxygen and water, in order to limit the corrosion thereof. The upper portion of the encapsulant 22 is between the cell 10 and the upper protective layer 24. The lower portion of the encapsulant 22 is between the cell 10 and the backsheet 26.

In the presence of solar radiation, heating occurs inside the solar module and temperatures of 80° C. (or more) may be reached, which necessitates that the layers be perfectly bonded to one another throughout the life cycle of the module.

PRIOR ART

Currently, the majority of the photovoltaic encapsulation market corresponds to formulations based on an EVA to which a peroxide, a silane and various functional additives are added.

EVA exhibits many qualities and properties advantageous for this application. This is because it confers mainly very good properties of transparency, of mechanical strength and of resistance to aging and generally excellent thermomechanical and mechanical properties. Furthermore, this thermoplastic is relatively inexpensive, so that its use for this application has become virtually inescapable.

Nevertheless, the type of encapsulant based on EVA, with peroxide and silane, has one major disadvantage.

Specifically, when the environmental conditions have deteriorated, that is to say when the EVA encapsulant ages under hot and damp conditions (DHT (damp heat test): 85° C./85% RH (relative humidity)), this component is subject to hydrolysis which brings about the appearance of acetic acid, a source of yellowing of the encapsulant and of corrosion of the metal connections of the photovoltaic module.

A person skilled in the art might envisage the replacement of the EVA by an ethylene/alkyl acrylate copolymer but this solution, although admittedly avoiding the specific problems related to EVA when the latter is present in a difficult environment, does not make it possible to obtain a correct photovoltaic module. This is because, during the lamination, numerous bubbles are formed during the crosslinking due to the peroxide, present in significant amounts.

Furthermore, document WO 2006/095911 provides a solution by the use of a formulation based on an ethylene/alkyl acrylate copolymer, the melting point of which (T in ° C.), obtained according to the standard JIS K 7121, would correspond to the following formula: $-3.0X+125 > T > -3.0X+109$, the component X representing the molar content of the polar comonomer (acrylate). Furthermore, this document provides for the combining of this copolymer with a silane in order to introduce the adhesive properties on the glass.

However, such a formulation would not make it possible to obtain an encapsulant which is effective over the long term. This is because the silane exhibits the disadvantage of not making possible a good level of adhesion to the glass when it is not chemically bonded to the polymer.

Thus, an encapsulation solution based on an alternative component to EVA but exhibiting properties which are just as advantageous, while eliminating the risk of giving off acetic acid, is currently being sought.

This solution should furthermore enable the use of silane, making possible in particular the attachment to the walls of the frontsheet, that is to say to a component made of glass-ceramic or synthetic glass (conventionally PMMA).

BRIEF DESCRIPTION OF THE INVENTION

It has been found, by the applicant company, after various experiments, that a composition based on an ethylene/alkyl acrylate copolymer and on silane could, with a very low content of crosslinking agent(s), exhibit highly satisfactory thermomechanical properties and physicochemical characteristics.

Thus, the present invention relates to a photovoltaic module encapsulant intended to encase a photovoltaic cell, comprising:

an ethylene/alkyl acrylate copolymer, the melt flow index, MFI, of said copolymer being between 1 g/10 min and 40 g/10 min;

a silane, representing between 0.1% and 0.5% of the weight of said composition;

characterized in that it additionally comprises a crosslinking agent representing between 0.1% and 0.5% of the weight of the composition and in that said copolymer represents at least 99% of the weight of said composition.

The applicant company has in fact discovered that there was a very specific advantage in carrying out an "incomplete crosslinking". The crosslinking agent, preferably selected from the monoperoxycarbonate family and more specifically consisting of Luperox® TBEC or (OO-tert-butyl O-(2-ethylhexyl) monoperoxycarbonate), present in a very small amount, enables the grafting of the silane to the copolymer and sufficiently crosslinks the latter in order to render it creep resistant without having to achieve a significant gel level. This very small content of peroxide avoids any problem of appearance of bubbles in the lamination step.

This "incomplete crosslinking" has the advantage of being able to be carried out in the lamination step, as carried out currently, but also starting from the extrusion of the encapsulant film thus then enabling a faster lamination.

The composition according to the invention first exhibits the following advantages:

the impossibility of the appearance of acetic acid, more generally of any acid, during its use, whatever the environmental conditions;

the maintenance of excellent adhesive properties of the composition throughout the lifetime of the composition, in particular in its use as encapsulant of a photovoltaic module;

improving the optical properties during aging in a difficult environment;

the maintenance of excellent thermomechanical properties and of physicochemical characteristics, at least as satisfactory as the current solution based on EVA (crosslinking agent and silane).

Other characteristics and distinctive features of the primary mixture of the invention are presented below:

advantageously, the crosslinking agent belongs to the monoperoxycarbonate family, preferably consists of OO-tert-butyl O-(2-ethylhexyl) monoperoxycarbonate;

preferably, for the abovesaid copolymer, the weight content of ethylene is between 50% and 85%, preferably between 60% and 84%, and the weight content of alkyl acrylate is between 15% and 50%, preferably between 16% and 40%;

advantageously, the silane consists of a vinyl silane or (meth)acrylic silanes;

according to a nonlimiting specification of the invention, the silane consists of methacryloxypropylsilane;

advantageously, the crosslinking agent represents less than 0.3% of the weight of the composition;

preferably the above said copolymer has a melt flow index, MFI, between 2 g/10 min and 10 g/10 min;

according to one possibility offered by the invention, the composition consists solely of the abovesaid copolymer, the abovesaid crosslinking agent and the abovesaid silane;

according to another possibility offered by the invention, the composition additionally comprises additives intended to confer additional specific properties, in particular plasticizers, adhesion promoters, UV stabilizers and absorbers, antioxidants, flame retardants and/or fillers.

The invention also relates to the use of the encapsulant as described above in a photovoltaic module.

Finally, the invention relates to a photovoltaic module comprising a structure consisting of a combination of at least one encapsulant and a frontsheet or backsheet, characterized in that the encapsulant is as described above.

DESCRIPTION OF THE APPENDED FIGURES

The description which follows is given solely by way of illustration and without implied limitation with reference to the appended figures, in which:

FIG. 1, which is already described, represents an example of a photovoltaic cell, the portions (a) and (b) being ¾ views, the portion (a) showing an individual cell before connection and the portion (b) a view after connection of 2 individual cells; the portion (c) is a top view of a complete photovoltaic cell.

FIG. 2, which is already described, represents a cross section of a photovoltaic module, the "conventional" photovoltaic sensor of which is encapsulated by an upper encapsulant film and a lower encapsulant film.

DETAILED DESCRIPTION OF THE INVENTION

As regards the ethylene/alkyl acrylate copolymer, it is a component well known to a person skilled in the art. The distinctive features specific to this copolymer, within the context of the present invention, essentially originate from the weight proportions of ethylene and of alkyl acrylate and from the melt flow index, MFI, of the copolymer, expressed in grams per 10 minutes and measured at 190° C. under a load of 2.16 kg.

The weight content of ethylene being between 50% and 85%, preferably between 60% and 84%, and the weight content of alkyl acrylate is between 15% and 50%, preferably between 16% and 40%;

The melt flow index (MFI) of the copolymer being between 1 g/10 min and 40 g/10 min, preferably between 2 g/10 min and 10 g/10 min.

As nonlimiting example, the applicant company makes use commercially of a component known as LOTRYL®, which is an ethylene/alkyl acrylate copolymer.

A person skilled in the art fully knows how to produce/manufacture such a copolymer, according to the different amounts of each of the two monomers. Hereinafter, the invention is presented with an ethylene/alkyl acrylate copolymer of specific type but it has been demonstrated by the proprietor that the encapsulant composition according to the invention meets the objectives set when the copolymer varies within the ranges of content of ethylene and of alkyl acrylate which are defined above, possibly in a slightly better way when said copolymer has contents of ethylene and of alkyl acrylate which are chosen within the ranges preferred for these two monomers.

As regards the silane, these are chemical compounds which make possible the adhesion interactions between the encapsulant and the glass. As examples of silane, mention may be made of 3-(trimethoxysilyl)propyl methacrylate, vinyltrimethoxysilane or any other silane bearing a function that is reactive with respect to a peroxide-type crosslinking agent. Preferably, the silane in the composition according to the invention is 3-(trimethoxysilyl)propyl methacrylate. Nevertheless, equivalent or substantially equivalent results would be obtained by choosing another silane from the family of vinylsilanes or (meth)acrylic silanes.

Regarding the crosslinking agent, this element, which decomposes to initiate and propagate chemical reactions (with the silane for the grafting of the latter to the copolymer chains) and crosslinking reactions (of the copolymer), is well known to a person skilled in the art and it does not present any difficulties for its manufacture/preparation.

It should be noted here that a particular family of crosslinking agents corresponds best to the objectives set within the context of the present patent application: these are monoperoxycarbonates, and among these in particular OO-tert-butyl O-(2-ethylhexyl) monoperoxycarbonate which is sold especially by the applicant company under the trademark Luperox® TBEC.

The composition forming the encapsulant according to the invention could optionally comprise a certain number of additives intended to confer additional specific properties.

Plasticizers could be added in order to facilitate the processing and to improve the productivity of the process for the manufacture of the composition and of the structures. Mention will be made, as examples, of paraffinic, aromatic or naphthalenic mineral oils, which also make it possible to improve the adhesiveness of the composition according to the invention. Mention may also be made, as plasticizer, of phthalates, azelates, adipates or tricresyl phosphate.

Adhesion promoters, although not necessary, may advantageously be added in order to improve the adhesiveness of the composition when the adhesiveness has to be particularly high. The adhesion promoter is a nonpolymeric ingredient; it may be organic, crystalline, inorganic and more preferably semi-inorganic semi-organic. Mention may be made, among these, of titanates.

In this specific application of the composition with photovoltaic modules, as UV radiation is capable of resulting in a slight yellowing of the composition used as encapsulant of said modules, UV stabilizers and UV absorbers, such as benzotriazole, benzophenone and other hindered amines, may be added in order to ensure the transparency of the encapsulant during its lifetime. These compounds may, for example, be based on benzophenone or on benzotriazole. They may be added in amounts of less than 10% by weight of the total weight of the composition and preferably from 0.05% to 3%.

It will also be possible to add antioxidants in order to limit the yellowing during the manufacturing of the encapsulant, such as phosphorus-based compounds (phosphonites and/or phosphites) and hindered phenolic compounds. These antioxidants may be added in amounts of less than 10% by weight of the total weight of the composition and preferably from 0.05% to 3%.

Flame retardants may also be added. These retardants may be halogenated or nonhalogenated. Among the halogenated retardants, mention may be made of brominated products. Use may also be made, as nonhalogenated retardant, of phosphorus-based additives, such as ammonium phosphate, polyphosphate, phosphinate or pyrophosphate, melamine cyanurate, pentaerythritol, zeolites and the mixtures of these retardants. The composition may comprise these retardants in proportions ranging from 3% to 40%, with respect to the total weight of the composition.

It is also possible to add pigments, such as, for example, titanium dioxide, dyeing compounds or brightening compounds in proportions generally ranging from 5% to 15%, with respect to the total weight of the composition.

Fillers, in particular inorganic fillers, may also be added to improve the thermomechanical strength of the composition. Examples which will be given are, without implied limitation, silica, alumina or calcium carbonates or carbon nanotubes or also glass fibers. Use may also be made of modified or nonmodified clays which are mixed at the nanoscale; this makes it possible to obtain a more transparent composition.

Crosslinking/Preparation of the Encapsulant and Production of an Encapsulant Film According to the Invention (Intended to be Incorporated in a Photovoltaic Module):

Conventionally, a crosslinking is necessary in order to adjust the thermomechanical properties of the EVA-based encapsulant, in particular when the temperature becomes very high. In this particular case, within the context of the present invention, the crosslinking is not complete owing to a very low content of crosslinking agent(s), but allows the grafting of the silane to the copolymer chains and a partial crosslinking of this copolymer.

The other elements of the composition, namely the silane and optionally the fillers, are added to the crosslinking agent and to the aforesaid copolymer in a conventional manner, well known to a person skilled in the art.

With regard to the aspects targeted above, the handbook entitled "Handbook of Polymer Foams and Technology", in particular on pages 198 to 204, provides additional instructions to which a person skilled in the art may refer.

As regards the aspects of the invention relating to the use of the thermoplastic composition in a photovoltaic module, a person skilled in the art may refer, for example, to the "Handbook of Photovoltaic Science and Engineering", Wiley, 2003. This is because the composition of the invention can be used as encapsulant or encapsulant-backsheet in a photovoltaic module, the structure of which is described in connection with the appended figures.

Materials Employed in Order to Form the Test Formulations:

Lotryl® 17BA07: ethylene/butyl acrylate copolymer, the acrylate content of which is 17% by weight of the copolymer and the MFI of which is 7 g/10 min (190° C., 2.13 kg). It is obtained according to an autoclave process and its melting point is 89° C.

In the tables of results presented below, this Lotryl® is denoted by the initials 17BA07.

Lotryl® 20MA08: ethylene/methyl acrylate copolymer, the acrylate content of which is 20% by weight of the copolymer and the MFI of which is 8 g/10 min (190° C., 2.13 kg). It is obtained according to an autoclave process and its melting point is 75° C.

In the tables of results presented below, this Lotryl® is denoted by the initials 20MA08.

Lotryl® 35BA40: ethylene/butyl acrylate copolymer, the acrylate content of which is 35% by weight of the copolymer and the MFI of which is 40 g/10 min (190° C., 2.13 kg). It is obtained according to an autoclave process and its melting point is 66° C.

In the tables of results presented below, this Lotryl® is denoted by the initials 35BA40.

Lotryl® 35BA320: ethylene/butyl acrylate copolymer, the acrylate content of which is 35% by weight of the copolymer and the MFI of which is 320 g/10 min (190° C., 2.13 kg). It is obtained according to an autoclave process and its melting point is 65° C.

In the tables of results presented below, this Lotryl® is denoted by the initials 35BA320.

Lotryl® 28MA07: ethylene/methyl acrylate copolymer, the acrylate content of which is 28% by weight of the copolymer and the MFI of which is 7 g/10 min (190° C., 2.13 kg). It is obtained according to an autoclave process and its melting point is 68° C.
In the tables of results presented below, this Lotryl® is denoted by the initials 28MA07.

Lotryl® 7BA01: ethylene/butyl acrylate copolymer, the acrylate content of which is 7% by weight of the copolymer and the MFI of which is 1 g/10 min (190° C., 2.13 kg). It is obtained according to an autoclave process and its melting point is 105° C.
In the tables of results presented below, this Lotryl® is denoted by the initials 7BA01.

Evatane® 3345PV: ethylene/vinyl acetate copolymer, the acetate content of which is 33% by weight of the copolymer and the MFI of which is 45 g/10 min (190° C., 2.13 kg). In the tables of results presented below, this Evatane® is denoted by the initials 3345PV.

Dynasylan MEMO: 3-MethacryloyloxypropylTrimethoxySilane sold by Evonik.
In the tables of results presented below, this silane is denoted by the initials MTS.

Luperox® TBEC: OO-tert-butyl O-(2-ethylhexyl) monoperoxycarbonate sold by the applicant company Arkema, denoted hereinafter by TBEC.

Luperox® 101: 2,5-dimethyl-2,5-di(tert-butylperoxy)hexane, sold by the applicant company Arkema, denoted hereinafter by 101.

Production of the Test Films and Formulations:

Preparation of the Films:

The encapsulant films are obtained by extrusion of granules of impregnated polymers:

The silanes, and where appropriate, the peroxide are added by impregnation of Lotryl or Evatane granules. Granules and liquid are placed in a flask and the flask is positioned on a roll mixer for 3 hours at a speed of 60 rotations per minute.

After impregnation, these granules, and also optionally additional granules, are placed in the feed hopper of an extruder with a slot die having a width of 10 cm.

The extrusion is carried out at a temperature appropriate to the composition; thus, for the compositions based on Luperox TBEC, this temperature is limited to 90° C., as, above this temperature, the peroxide would decompose. For compositions based on Luperox 101, this temperature may reach 100° C. to 110° C.

This extrusion makes it possible to obtain a reel of film, the drawing of which at the extruder outlet is adjusted so as to obtain a film with a thickness of between 350 and 550 μm (micrometers).

Preparation of the Test Modules:

In order to characterize the formulations, test modules are obtained by hot lamination.

The structure of a test module can be varied according to the characterizations to be carried out:

Measurement of creep and of optical properties by transmission: Glass (4 mm)/Encapsulant film/Glass (4 mm)

Measurement of adhesion: Glass (4 mm)/Encapsulant film/Apolhya backsheet

The laminator used is provided by P energy. The lamination conditions are dependent on the composition of the laminated films.

Thus, in the case of a formulation based on TBEC, the cycle observed is the following:

| | Duration (s) | T (° C.) | $V_{up}$ (mbar) | $V_{down}$ (mbar) |
|---|---|---|---|---|
| Prestart | 10 | 85 | 0 | 1000 |
| 1 | 10 | 85 | 0 | 0 |
| 2 | 180 | 85 | 0 | 0 |
| 3 | 10 | 85 | 900 | 0 |
| 4 | 10 | 85 | 1000 | 0 |
| 5 | 600 | 150 | 1000 | 0 |
| 6 | 360 | 150 | 1000 | 0 |
| 7 | 10 | 150 | 0 | 0 |
| 8 | 10 | 150 | 0 | 0 |
| 9 | — | 50 | 0 | 1000 |

Furthermore, in the case of a formulation based on Luperox 101, the temperature is adjusted owing to the higher decomposition temperature of this peroxide. The cycle observed is therefore the following:

| | Duration (s) | T (° C.) | $V_{up}$ (mbar) | $V_{down}$ (mbar) |
|---|---|---|---|---|
| Prestart | 10 | 110 | 0 | 1000 |
| 1 | 10 | 110 | 0 | 0 |
| 2 | 180 | 110 | 0 | 0 |
| 3 | 10 | 110 | 900 | 0 |
| 4 | 10 | 110 | 1000 | 0 |
| 5 | 600 | 170 | 1000 | 0 |
| 6 | 360 | 170 | 1000 | 0 |
| 7 | 10 | 170 | 0 | 0 |
| 8 | 10 | 170 | 0 | 0 |
| 9 | — | 50 | 0 | 1000 |

Tests Carried Out on the Test Specimens (Compositions E1 to E4 and CE1 to CE5):

The present invention is illustrated in more detail by the following nonlimiting examples.

The compositions denoted E1, E2, E3 and E4 in the table below are compositions in accordance with the invention while the compositions CE1, CE2, CE3, CE4 and CE5 are compositions according to the prior art and/or not in accordance with the present invention.

| | Constituent 1 | Content (% by weight of the composition) | Constituent 2 | Content (% by weight of the composition) | Constituent 3 | Content (% by weight of the composition) |
|---|---|---|---|---|---|---|
| E1 | 28MA07 | 99.5 | MTS | 0.3 | TBEC | 0.2 |
| E2 | 17BA07 | 99.6 | MTS | 0.3 | 101 | 0.1 |
| E3 | 20MA08 | 99.6 | MTS | 0.3 | 101 | 0.1 |
| E4 | 35BA40 | 99.3 | MTS | 0.3 | TBEC | 0.4 |
| CE1 | EVA3345PV | 98.2 | MTS | 0.3 | TBEC | 1.5 |
| CE2 | 20MA08 | 99.7 | MTS | 0.3 | — | — |
| CE3 | 7BA01 | 99.6 | MTS | 0.3 | 101 | 0.1 |

-continued

|  | Constituent 1 | Content (% by weight of the composition) | Constituent 2 | Content (% by weight of the composition) | Constituent 3 | Content (% by weight of the composition) |
|---|---|---|---|---|---|---|
| CE4 | 35BA320 | 99.2 | MTS | 0.3 | TBEC | 0.5 |
| CE5 | 35BA40 | 98.7 | MTS | 0.3 | TBEC | 1.0 |

It will be noted that the test specimens targeted above exhibit identical amounts of silane, fixed at 0.3% of the weight of the composition. Nevertheless, additional tests have made it possible to identify that the amount of silane in the composition could be between 0.1% and 0.5% by weight of said composition.

The examples of the composition according to the invention all have the same thicknesses but it is clearly understood that a person skilled in the art could vary them as a function of the application of the photovoltaic module and of the performance of the latter.

Measurements of Optical Properties by Transmittance:

The optical properties by transmittance are measured on glass/encapsulant/glass structures using a spectrocolorimeter of the Minolta brand. The measurement conditions are as follows:
  Wavelength: 360 nm-740 nm (nanometers)
  Illuminant: C
  Angle: 2°
  Measurement opening: LAV 25 mm (millimeters)
  Background: "Cera" white plate+light well Two pieces of numerical data are taken from this measurement:
  Haze: the haze corresponds to the degree of haze of the structure studied. It is calculated according to the standard ASTM D-1003-007)
  Transparency: the degree of transparency is calculated by taking the mean transmittance value between 400 and 740 nm, corrected by respective contributions of the glass layers and of the glass/air and glass/encapsulant interfaces, then standardized to a thickness of 200 μm. The transparency was also evaluated during DHT (damp heat test—85° C./85% relative humidity/2000 h) aging.

In order to meet the requirements of the invention, the transparency test should display a result above 96% and the haze test a result below 20.

Creep Test:

The creep test is carried out on glass/encapsulant/glass structures (with glass sheets having a length L=70 mm). After lamination, the test modules are placed on a metal structure forming an angle of 70° with the horizontal. Each module is held back by an edge covering a portion of the thickness of the first glass layer.

This structure is placed at 100° C. in an oven. Under the weight of the second glass layer, creep may be observed. The creep value measured is thus the distance traveled by the second glass sheet after 500 hours under these conditions. This distance is between 0 mm (no creep) and 70 mm (complete creep, separation of the structure).

In order to meet the requirements of the invention, the creep measurement should display a result of less than 4 mm.

Adhesion Test on a Glass Layer:

The degree of adhesion between the encapsulant and the glass is measured on glass/encapsulant/backsheet structures using a 90° peel test carried out at 50 mm/min (millimeters per minute) on a Zwick 1445 universal testing machine. The backsheet used for this measurement is a monolayer consisting of Apolhya® manufactured and sold by the applicant company. The measurement conditions are as follows:
  Rate of displacement of the crosspiece: 50 mm/min
  Test specimen cut-out width: 10 mm
  Peel angle: 90°

The adhesion result is expressed in N/mm.

In order to meet the requirements of the invention, the adhesion measurement should display a result of greater than 3.5 N/mm.

Tests on the encapsulant were also carried out in order to confirm that this novel structure retains excellent properties, that is to say identical properties, relative to the properties of an encapsulant in accordance with that described in the document WO 09138679, namely in particular relating to its mechanical, thermomechanical and fire retardant properties and its electrical insulation properties. These tests proved to be positive.

The yellowing properties of the encapsulant, formulated as described in the present invention, were evaluated during DHT (damp heat test—85° C./85% relative humidity/2000 h) aging. The results obtained proved to be better than those obtained for a formulation according to the prior art.

The compositions according to the invention thus meet the criteria to be able to be very advantageously used as binder or encapsulant in solar modules.

Results of the Tests Carried Out on the Test Specimens of the Different Formulations:

| Compositions | Adhesion (N/mm) | Opt. Transmittance Prop. | | DHT 2000 h | Creep 70°/ 110° C. (mm/70 mm - 500 h) |
| | | % T$_{400\ \mu m}$ (%) | Haze | % T$_{400\ \mu m}$ (%) | |
|---|---|---|---|---|---|
| E1 | 6.7 | 99.5 | 1.5 | 98 | 2.5 |
| E2 | 3.8 | 94 | 15 | 93.8 | 1.5 |
| E3 | 6.2 | 98 | 3 | 97.6 | 2 |
| E4 | 4.6 | 99.7 | 0.9 | 99.2 | 3.5 |
| CE1* | 6.2* | 99.6* | 1* | 93.5 | 0* |
| CE2 | 0.9 | 97.6 | 3.5 | 97 | 70 |
| CE3 | 3.5 | 91 | 25 | 89.8 | 1 |
| CE4 | 4.2 | 99.6 | 0.9 | 99.3 | 12 |
| CE5 | No measurement performed, presence of a very large quantity of bubbles in the encapsulant layer | | | | |

*The results obtained on the CE1 test specimen (formulation according to the prior art) are good, but the formation of acetic acid during the DHT aging is detected and gives rise to an intense yellowing of this encapsulant.
This phenomenon is not observed on any of the samples produced according to the present invention.

The invention claimed is:

1. An encapsulant composition of a photovoltaic module, configured to encase a photovoltaic cell, the encapsulant composition comprising:
  an ethylene/alkyl acrylate copolymer that has a melt flow index, MFI, between 1 g/10 min and 40 g/10 min, wherein the alkyl acrylate is either methyl acrylate or butyl acrylate;

a silane, representing between 0.1% and 0.5% of the weight of said encapsulant composition;

wherein the encapsulant composition additionally comprises a crosslinking agent, wherein the crosslinking agent either is 2,5-dimethyl-2,5-di(tert-butylperoxy)hexane or belongs to the monoperoxycarbonate family and represents between 0.1% and 0.5% of the weight of the encapsulant composition, wherein said copolymer represents at least 99% of the weight of said encapsulant composition, and wherein the encapsulant composition possesses a creep measurement less than 4 mm when laminated onto a glass structure and heated at 110° C. for 500 hours.

2. The encapsulant composition as claimed in claim 1 wherein, for the above said copolymer, the weight content of ethylene is between 50% and 85%, and the weight content of alkyl acrylate is between 15% and 50%.

3. The encapsulant composition as claimed in claim 1, wherein the silane consists of a vinyl silane or (meth)acrylic silanes.

4. The encapsulant composition as claimed in claim 3, wherein the silane consists of 3-(trimethoxysilyl)propyl methacrylate.

5. The encapsulant composition as claimed in claim 1, wherein the crosslinking agent represents between 0.1% and 0.3% of the weight of the encapsulant composition.

6. The encapsulant composition as claimed in claim 1, wherein the copolymer has a melt flow index, MFI, between 2 g/10 min and 10 g/10 min.

7. The encapsulant composition as claimed in claim 1, wherein the encapsulant composition consists of the copolymer, the abovesaid crosslinking agent and the abovesaid silane.

8. The encapsulant composition as claimed in claim 1, wherein the encapsulant composition additionally comprises additives intended to confer additional specific properties.

9. A photovoltaic module comprising the encapsulant composition as claimed in claim 1.

10. A photovoltaic module comprising a structure consisting of a combination of at least one encapsulant and a frontsheet or a backsheet, wherein the at least one encapsulant is an encapsulant composition as claimed in claim 1.

11. The encapsulant composition as claimed in claim 1, wherein the crosslinking agent in the encapsulant composition produces an incomplete crosslinking.

12. The encapsulant composition as claimed in claim 1, wherein no acetic acid formation is detected after exposure of said composition to DHT testing, wherein DHT testing occurs at 85° C. in 85% relative humidity for at least 2000 hours.

13. The encapsulant composition as claimed in claim 1, wherein said encapsulant does not become yellow after exposure of said composition to DHT testing, wherein DHT testing occurs at 85° C. in 85% relative humidity for at least 2000 hours.

14. The encapsulant composition as claimed in claim 1, wherein the crosslinking agent does not cause bubbles to form during a lamination step.

* * * * *